United States Patent
Cho et al.

(10) Patent No.: US 10,358,343 B2
(45) Date of Patent: Jul. 23, 2019

(54) METAMATERIAL CLOSED RING RESONATOR

(71) Applicant: Regents of the University of Minnesota, Minneapolis, MN (US)

(72) Inventors: Jeong-Hyun Cho, Woodbury, MN (US); Chao Liu, Heilongjiang Province (CN)

(73) Assignee: Regents of the University of Minnesota, Minneapolis, MN (US)

(*) Notice: Subject to any disclaimer, the term of this patent is extended or adjusted under 35 U.S.C. 154(b) by 0 days.

(21) Appl. No.: 15/949,794

(22) Filed: Apr. 10, 2018

(65) Prior Publication Data

US 2018/0294795 A1     Oct. 11, 2018

Related U.S. Application Data

(60) Provisional application No. 62/483,793, filed on Apr. 10, 2017.

(51) Int. Cl.
| | |
|---|---|
| *B82B 3/00* | (2006.01) |
| *H03H 9/24* | (2006.01) |
| *H03H 3/00* | (2006.01) |
| *H01P 7/08* | (2006.01) |
| *H01P 7/10* | (2006.01) |
| *B82B 1/00* | (2006.01) |
| *B82Y 15/00* | (2011.01) |

(52) U.S. Cl.
CPC .......... *B82B 3/0014* (2013.01); *H01P 7/082* (2013.01); *H01P 7/10* (2013.01); *H03H 3/00* (2013.01); *H03H 9/24* (2013.01); *B82B 1/001* (2013.01); *B82Y 15/00* (2013.01); *Y10S 977/762* (2013.01); *Y10S 977/81* (2013.01); *Y10S 977/888* (2013.01); *Y10S 977/932* (2013.01)

(58) Field of Classification Search
CPC ......... B82B 3/0014; B82B 1/001; G02B 6/00; H01B 1/02; B81B 2203/0361; Y10S 977/81; Y10S 977/762; Y10S 977/888; Y10S 977/932; H01P 7/08; H03H 9/24; H03H 3/00
USPC ....................................................... 333/219
See application file for complete search history.

(56) References Cited

PUBLICATIONS

Hu et al., "Design of Six-Band Terahertz Perfect Absorber Using a Simple U-Shaped Closed-Ring Resonator", IEEE Photonics Journal, vol. 8, No. 2, Apr. 2016.*

Anandan et al., "Nanopillar array structures for enhancing bio sensing performance", International Journal of Nano medicine 2006:1(1) pp. 73-79.*

Lim et al., "Micro and nanotechnology for biological and biomedical applications", Medical & biological engineering & computing, 48.10 (2010): 941-943.

(Continued)

*Primary Examiner* — Benny T Lee
*Assistant Examiner* — Hafizur Rahman
(74) *Attorney, Agent, or Firm* — Dicke, Billig & Czaja, PLLC

(57) ABSTRACT

Nanopillar-based closed ring resonator (CRR) MMs, utilizing displacement current in the nano gap medium between nanopillars that significantly increases energy storage in the MMs, leading to an enhanced Q-factor of at least 11000. A metallic nanopillar array is designed in the form of a closed ring (e.g., square-shape) CRR.

10 Claims, 18 Drawing Sheets

(56) References Cited

PUBLICATIONS

Grenier et al., "Resonant based microwave biosensor for biological cellsdiscrimination", Radio and Wireless Symposium (RWS), 2010 IEEE. IEEE, 2010.

Urban, Micro-and nanobiosensors-state of the art and trends, Measurement Science and Technology 20.1 (2009): Jan. 2001.

El-Ali et al., "Cells on chips", Nature 442.7101 (2006): 403-411.

Warriner et al., "Nanostructure and Dynamics of Biocompatible Surfactant Monolayers and Bilayers", Handbook of Nanostructured Biomaterials and Their Applications in Nanobiotechnology, vol. 1, 2005, pp. 1-57.

Fritz et al., "Translating biomolecular recognition into nanomechanics", Science 288.5464 (2000): 316-318.

Arlett et al., "Comparative advantages of mechanical biosensors", Nature nanotechnology 6.4 (2011): 203-215.

Luo et al., "Electrical by biosensors and the label free detection of protein disease biomarkers", Chemical Society Reviews 42.13 (2013): 5944-5962.

Vo-Dinh et al., "Biosensors and biochips: advances in biological and medical diagnostics", Fresenius' journal of analytical chemistry 366.6-7 (2000): 540-551.

Menikh et al., "Terahertz Biosensing Technology: Frontiers and Progress", ChemPhysChem 2002, 3(8): 655-658.

O'Hara et al., "Thin-film sensing with planar terahertz metamaterials: sensitivity and limitations", Optics Express, Feb. 4, 2008, 16(3): 1786-1795.

Park et al., "Detection of microorganisms using terahertz metamaterials", Scientific Reports, 2014, 4:4988.

Abduljabar et al., "Novel Microwave Microfluidic Sensor Using a Microstrip Split-Ring Resonator", IEEE Transactions on Microwave Theory and Techniques, vol. 62, No. 3, Mar. 2014.

Fedotov et al., "Sharp Trapped-Mode Resonances in Planar Metamaterials with a Broken Structural Symmetry", Physical Review Letters, Oct. 5, 2007, 99(14): 147401.

Tsakmakidis et al., "Negative-permeability electromagnetically induced transparent and magnetically active metamaterials", Physical Review B, 2010, 81(19): 195128.

Jansen et al., "Terahertz metasurfaces with high Q-factors", Applied Physics Letters, 2011, 98(5): 051109.

Al-Naib et al., "Ultra-high Q even eigenmode resonance in terahertz metamaterials", Applied Physics Letters, 2015, 106(1): 011102.

Naqui et al., "Transmission Lines Loaded with Bisymmetric Resonators and Their Application to Angular Displacement and Velocity Sensors", IEEE Transactions on Microwave Theory and Techniques, vol. 61, No. 12, Dec. 2013, 4700-4713.

Elliott, Electromagnetics: History[J]. Theory, and Applications (New York: IEEE), 1993, pp. 9-33.

\* cited by examiner

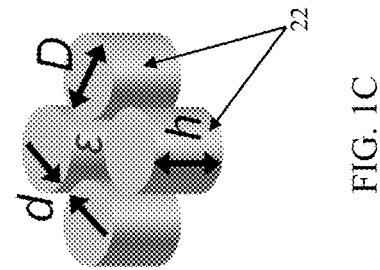
FIG. 1C
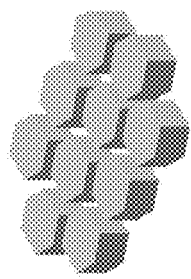
FIG. 2C
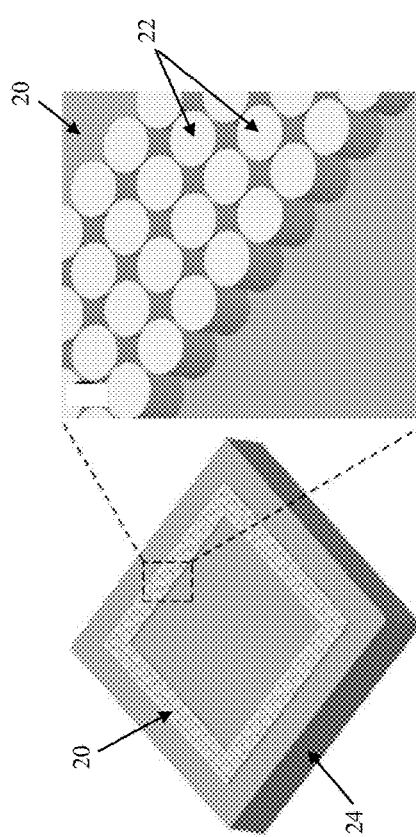
FIG. 1B
FIG. 1A
FIG. 2B
FIG. 2A

METAMATERIAL CLOSED RING RESONATOR

CROSS-REFERENCE TO RELATED APPLICATIONS

This Non-Provisional Patent Application claims the benefit of the filing date of U.S. Provisional Patent Application Ser. No. 62/483,793, filed Apr. 10, 2017, the entire teachings of which are incorporated herein by reference.

This Non-Provisional Patent Application is related to U.S. Non-Provisional patent application Ser. No. 15/482,409, filed Apr. 7, 2017, entitled "Nanopillar-Based Article and Methods of Manufacture," the entire teachings of which are incorporated herein by reference.

GOVERNMENT SUPPORT CLAUSE

This invention was made with government support under CMMI-1454293 awarded by the National Science Foundation. The government has certain rights in the invention.

BACKGROUND

The present disclosure relates to metamaterials, such as terahertz metamaterials. More particularly, it relates to high quality-factor terahertz metamaterials designed as a microscale closed ring resonators, and methods for fabricating the same.

Metamaterials (MMs) are artificial materials that can create unique physical and optical properties unseen in natural materials that makes them suitable for various applications in sensors, optical devices, plasmonic devices, etc. For example, the resonant behavior of a MM is dependent upon its surroundings. The chemical and physical property changes of the media in which the MM is located can affect both the frequency and the magnitude of the resonant peaks. Thus, MMs, such as terahertz metamaterials (THz MMs), are good candidates as sensors for the detection of chemicals and biomaterials, temperature, strain, alignment, and position. THz MMs can also be used as frequency-agile devices by adding a dielectric material around the MMs.

MM can usually be achieved by engineering metallic components that are smaller than the wavelength of the incident electromagnetic wave to form periodic patterns or arrays. The special arrangement of the subwavelength metallic components can be used to manipulate electromagnetic waves in such a manner that the incident electromagnetic can be absorbed, transmitted, enhanced, bended and shifted. The ability to absorb and transmit electromagnetic waves at different frequencies gives the MM the potential to be used as microwave and optical absorbers, modulators, and filters. The MM can also be designed to enhance the electromagnetic signals, resulting in a high-gain antenna. By bending and controlling the path of light and electromagnetic waves inside and around the MM, perfect lenses and cloaking systems can also be achieved.

A common MM design is as a planar, film-based subwavelength resonator that allows electromagnetic wave coupling within the structure, resulting in the storage of energy inside the resonator. With MM sensor applications, the sensing resolution and frequency selectivity of the MMs depends on their quality factors (Q-factors) because high Q-factors mean the MMs have sharp resonant responses, allowing detection of small frequency shifts induced by substances around the MMs. The Q-factor is defined as the energy stored in the MM over the energy dissipated to its surroundings. A high Q-factor of the MM means that the MM has a high signal-to-noise ratio, which leads to high sensitivity and selectivity as MM sensors and MM frequency tunable devices. Even though THz MMs show great promise for sensing and tunable devices, their relatively low Q-factors (typically below 10 for a film-based single-ring resonator MM) as compared to micro and nanoscale mechanical resonators (typically between $10^4$ and $10^7$) impose limitations on their sensitivity. Further, the low Q-factor causes the resonant peak to be wide, which is not suitable for applications such as narrow bandwidth filters and modulators.

One of the approaches to increase the Q-factor of MMs is to reduce the energy losses of MMs and substrates by optimizing the material properties and structures of the MMs. There are typically three main energy loss mechanisms: Ohmic loss of MMs, dielectric loss of the substrate, and radiation loss of MMs. The most common method to increase Q-factor of MMs without changing material properties is to design asymmetric split resonators (ASRs) by breaking the symmetry of the MMs. The asymmetric design reduces the radiation loss of the resonator and increases Q-factor from 3 up to 30. Another method uses coupling between MMs in a super unit to excite both odd and even modes of the MMs. This approach improves Q-factor by a factor of 5 compared to typical film-based MMs. However, the Q-factor of THz MMs needs to be further enhanced (10 to 20 times) to meet the requirement of ultra-sensitive sensors.

Another factor that measures the sensitivity of MM sensors is how much the resonant frequency shift in the transmission spectrum when permittivities of the adjacent medium change. Modern detection techniques require sensors to have the ability to detect a very small quantity of substances, even single molecules. However, it is extremely difficult to achieve such a high sensitivity using typical film-based MM sensors because the response to changes of substance, in the form of small resonant frequency changes, can be hard to detect, especially when the volume or concentration of the substance around the MMs is not high enough. In order to develop sensors that can detect minute concentration of substances, large resonant frequency change in response to the change of the substance around the MMs is one of the key requirements.

SUMMARY

The inventors of the present disclosure recognized that a need exists for high Q-factor MMs designs.

Some aspects of the present disclosure are directed toward a nanopillar- or nanowire-based THz closed ring resonator (CRR) MMs, utilizing displacement current in the dielectric medium between nanopillars that significantly increases energy storage in the MMs, leading to enhanced Q-factor up to about 14000 (1400 times higher than that of typical thin-film-based MMs) in some embodiments. A metallic nanopillar array (e.g., gold nanopillars) is designed in the form of a closed ring (e.g., square-shape) CRR, with nano gaps defined between immediately adjacent ones of the nanopillars in the array. Electrical current and displacement current form in the nanopillars and nano gaps, respectively, by applying an electromagnetic field to the nanopillar-based CRR, creating a loop current circulating inside the CRR. The usage of nanopillars and nano gaps reduces the ohmic loss of the CRR and increases the energy storage in the nano gaps, which dramatically increases the Q-factor of the metamaterial. The resonant behaviors and the Q-factors of the nanopillar-based CRRs can be dependent upon the dimensional and geometric factors of the nanopillars and the nano gaps, leading to a large tenability of the device. Such ultra-high Q-factor metamaterials can be used, for example, biomedical sensors, optical modulators, plasmonic devices, etc.

With embodiments of the present disclosure, resonant frequency shifts resulting from exposure to substances with different permittivities are much larger for nanopillar-based MMs than for typical thin-film-based MMs. When the same amount of substance is applied to the MMs, nanopillar-based MMs have more effective structures involved compared to typical film-based MMs because nanopillars enormously increase the surface area of the MMs. This leads to larger frequency shift, resulting in highly sensitive sensors as well as enhanced tunability of frequency-agile MM devices.

BRIEF DESCRIPTION OF THE DRAWINGS

FIGS. 1A-1C schematically illustrate a nanopillar-based close ring resonator (CRR) in accordance with principles of the present disclosure and including a multiplicity of nanopillars;

FIGS. 2A-2C schematically illustrate nanopillar shapes useful with the nanopillar-based CRRs of the present disclosure;

DETAILED DESCRIPTION

Aspects of the present disclosure are directed to MMs incorporating nanopillars arranged to form a closed ring resonator (CRR). With this in mind, a non-limiting example of a right cylinder (circular cylinder) shaped nanopillars collectively forming (e.g., arrayed) a nanopillar-based CRR 20 in accordance with principles of the present disclosure is shown schematically in FIGS. 1A and 1B. The CRR 20 is formed by a multiplicity (e.g., thousands) of nanopillars 22, and can be optionally be fabricated on to a substrate 24 (e.g., silicon substrate). The geometry and material properties of the CRR 20 are defined by the height (h), width (or diameter) (D), nano gap size (d) and permittivity ($\varepsilon$) of the nanopillars 22 identified in FIG. 1C. Further, each of the nanopillars 22 can be designated as defining a side area (A) that "faces" an immediately adjacent nanopillar 22; with the optional right cylinder shape of FIG. 1C, the side area (A) can be designated as one-half of the side wall area of the cylinder (A=$\pi \cdot$(D/2)$\cdot$h). The nanopillars 22 are preferably identical, and can be formed of an appropriate, electrically conductive material (e.g., metal) such as gold, platinum, etc. While the nanopillars 22 are shown as having a circular cylinder shape, other shapes are also acceptable, such as square, triangle, hexagon, etc., as shown in FIGS. 2A-2C.

Figure 3:
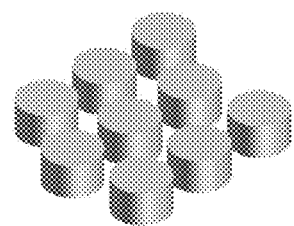
FIG. 3 schematically illustrates an arrangement of nanopillars useful with the nanopillar-based CRRs of the present disclosure.

Returning to FIGS. 1A and 1B, the nanopillars 22 can be arranged relative to one another in various fashions. For example, immediately adjacent ones of the nanopillars 22 can be aligned relative to one another as shown. In other embodiments, the some or all of the nanopillars 22 need not be aligned relative to one another. For example, FIG. 3 illustrates another arrangement in accordance with principles of the present disclosure in which the nanopillars 22 of adjacent rows are off-set relative to one another, establishing a zig-zag array or pattern.

Various methods are contemplated by the present disclosure for fabricating the nanopillars on a substrate; for example, in some non-limiting embodiments, the nanopillars are fabricated via a formed anodic aluminum oxide template as described in to U.S. Non-Provisional patent application Ser. No. 15/482,409, filed Apr. 7, 2017, entitled "Nanopillar-Based Article and Methods of Manufacture," the entire teachings of which are incorporated herein by reference.

Figure 4A:
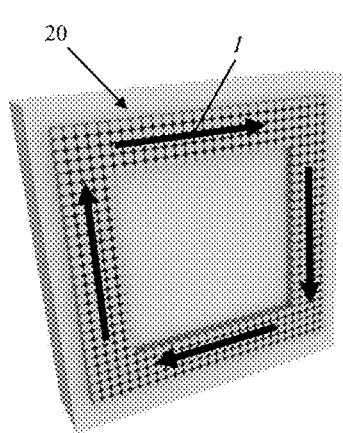
FIG. 4A schematically illustrates a nanopillar-based CRR in accordance with principles of the present disclosure along with a loop current traversing the CRR.
Figure 4B:
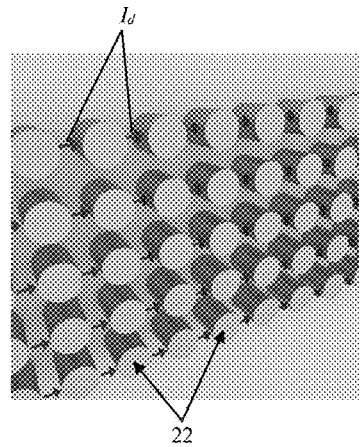
FIG. 4B is an enlarged view of a portion of the nanopillar-based CRR of FIG. 4A and identifying a displacement current between immediately adjacent ones of the nanopillars.

In some embodiments of the present disclosure, the electric field applied to the nanopillar-based CRR 20 generates displacement current inside the nano gaps d between immediately adjacent ones of the nanopillars 22. Displacement current can be defined as the current generated within dielectric media between two conductors by applying time-varying electric field to the system. The displacement current in the nano gaps d and the electrical current in the nanopillars 22 form the total current oscillating inside the CRR 20, resulting in the resonant behavior. By way of further explanation, FIG. 4A identifies the loop current I in the CRR 20 and FIG. 4B identifies the displacement current $I_d$ along the nano gaps d. When electromagnetic waves are applied to the nanopillar arrays with small enough gaps between nanopillars 22, a transient electric field is induced between the nanopillars 22. The changing electric field acts exactly like current, called the displacement current, flowing through the nanopillars 22 and forming a current loop along closed ring-shaped CRR 20.

In some embodiments, the nanopillar-based CRRs of the present disclosure can be regarded as an inductive-capacitive (LC) circuit, which has resonant responses to the incident wave. The displacement current ($I_d$) between two nanopillars 22 can be defined by the following equation:

$$I_d = -J_d \cdot A = -\frac{\partial E}{\partial t} \cdot A = -\frac{\omega \varepsilon A}{d} \cdot V_0 \sin \omega t \quad (1)$$

where $J_j$ is the displacement current density, A is the side are of two nanopillars (with an optional right cylinder nanopillar construction, the side area (A) can be designated as one-half of the side wall area of the cylinder (A=$\pi \cdot$(D/2)$\cdot$h)), E is the electric displacement field between two nanopillars, co is the angular resonant frequency of the electromagnetic wave, $\varepsilon$ is the permittivity of the space or nano gap between two nanopillars, d is the size of the nano gap (i.e., distance between two nanopillars), $V_0$ is the voltage amplitude between two nanopillars, and t is time.

Figure 5:
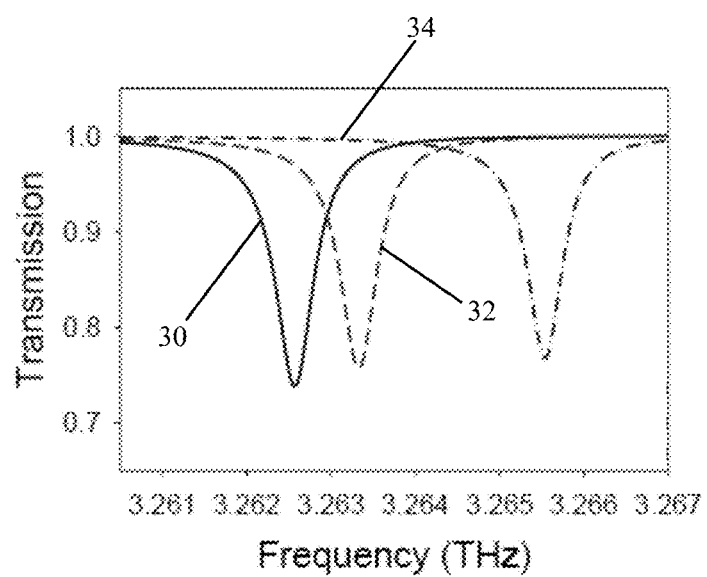
FIG. 5 is a graph of simulated transmission spectra of a nanopillar-based CRR in accordance with principles of the present disclosure.

By way of example, the displacement current effect was considered relative to the CRR 20 construction of FIGS. 1A-1B. The circular nanowires 22 were selected to demonstrate resonant behaviors induced by displacement current in CRRs. The circular nanowires 22 with nanoscale spacings (nanogaps) are patterned to collectively form a square-shaped CRR on a silicon substrate. When a terahertz pulse transmits through the plane of the CRR 20 under normal incident with the electric field, it induces transient charges on the surfaces of the nanopillars 22 and time varying displacement current ($I_d$) between the nanopillars 22 as described above. FIG. 5 provides simulated transmission spectra of a nanopillar-based CRR of the present disclosure at different nanogap sizes (d=20 nm (plot line 30), 30 nm (plot line 32), and 35 nm (plot line 34)) and the surface current distributions at a corresponding resonant frequency obtained using ANSYS HFSS (High Frequency Structural Simulator, version: 13.0.2) commercial software. The external electromagnetic field couples to the nanopillar-based CRR and excites resonant oscillations.

Figures 6A, 6B:
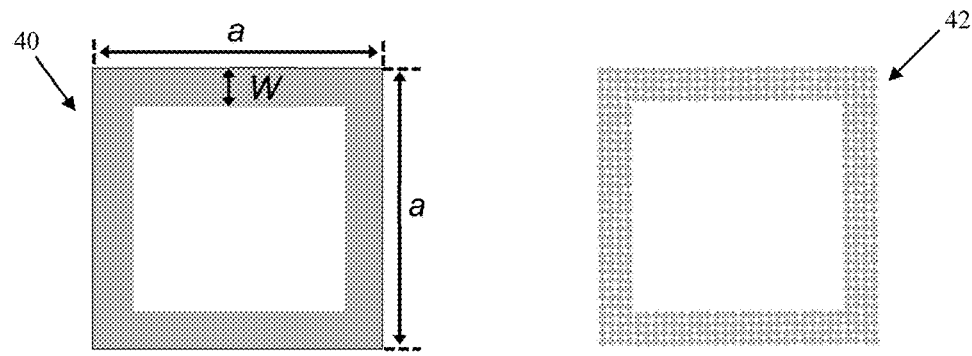
FIGS. 6A and 6B identify geometric characteristics common to a film-based CRR and a nanopillar-based CRR of the present disclosure.
Figure 6C:
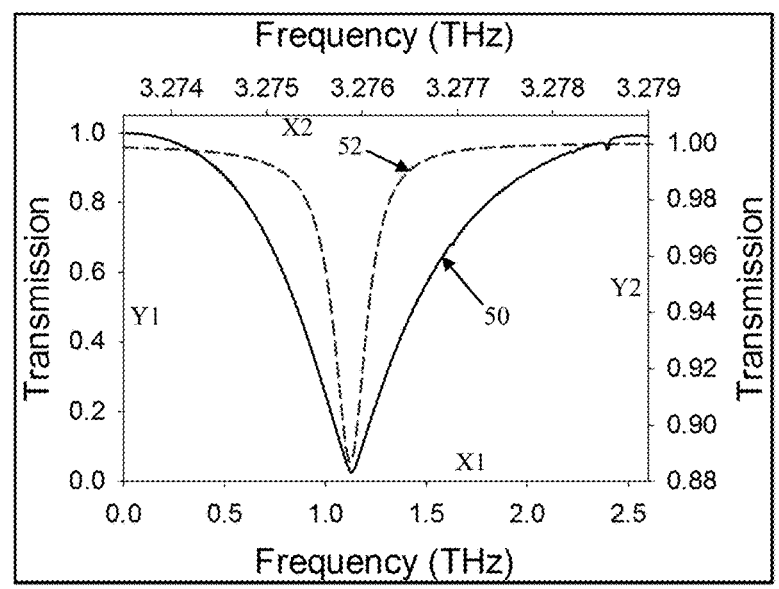
FIG. 6C is a graph of transmission spectra of film-based CRRs and nanopillar-based CRRs.

The Q-factor of the nanopillar-based CRRs of the present disclosure is much higher than a conventional film-based CRR. As a point of reference, FIGS. 6A and 6B show the geometric configurations of a conventional film-based CRR 40 and a nanopillar-based CRR 42 in accordance with the present disclosure, respectively. As identified, the CRRs 40, 42 can share common geometric parameters of overall length and width (a), and arm width (W). FIG. 6C presents a comparison of transmission spectra of the film-based CRR 40 (plot line 50 corresponding with axes X1, Y1) and the nanopillar-based CRR 42 (plot line 52 corresponding with axes X2, Y2). As shown, the resonant peak of the nanopillar-based CRR (plot line 52) is much sharper than that of the film-based CRR (plot line 50), evidencing the ultra-high Q-factor of the nanopillar-based CRR.

Figure 7:
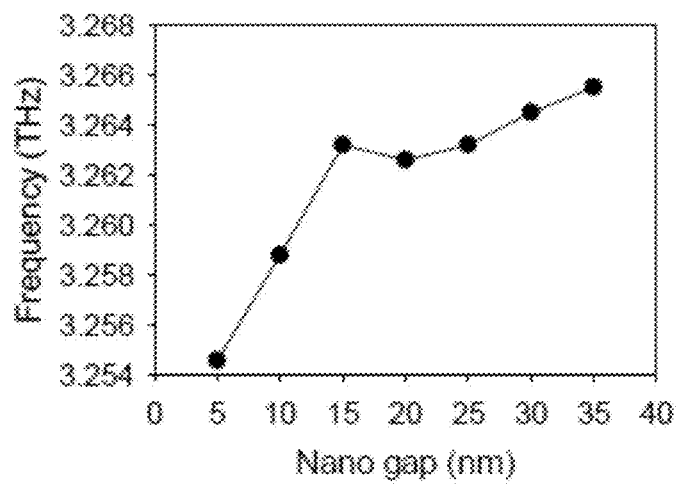
FIG. 7 is a graph of simulated resonant frequencies as a function of nano gap size of nanopillar-based CRRs in accordance with principles of the present disclosure.
Figure 8:
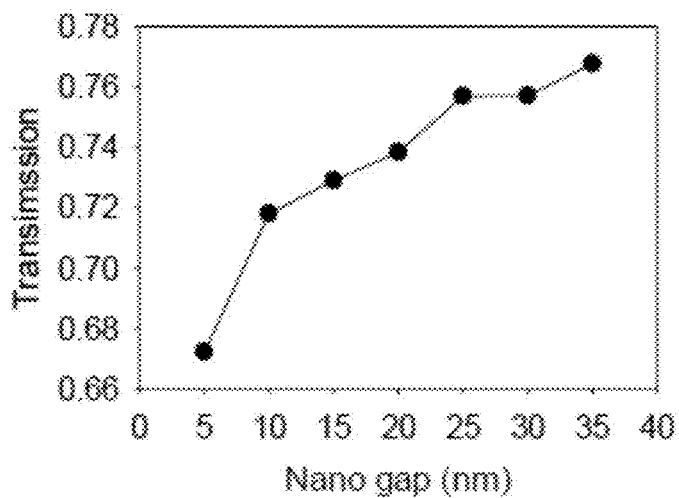
FIG. 8 is a graph of simulated transmissions as a function of nano gap size of nanopillar-based CRRs in accordance with principles of the present disclosure.

In some embodiments of the present disclosure, the nanopillar-based CRRs can be optimized by considering or characterizing the effect of physical conditions on the resonant behaviors using, for example, the HFSS simulator mentioned above. For example, FIG. 7 illustrates resonant frequency shift of nanopillar-based CRRs of the present disclosure as a function of nano gap size. The results indicate that the resonant frequency generally increases as nano gap size increases. This result is explained by an increase of nano gap size (d) decreasing the capacitance (C) between nanopillars due to C=$\varepsilon \cdot$A/d. The resonant frequency is inversely proportional to $\sqrt{C}$, resulting in an increase in the resonant frequency. Nano gap size was also found to influence transmission as shown in FIG. 8. Simulation results shown in FIGS. 7 and 8 also indicate ways of tuning the resonance of the nanopillar-based CRRs to achieve desired resonant frequencies and strong resonant behaviors.

Figure 9:
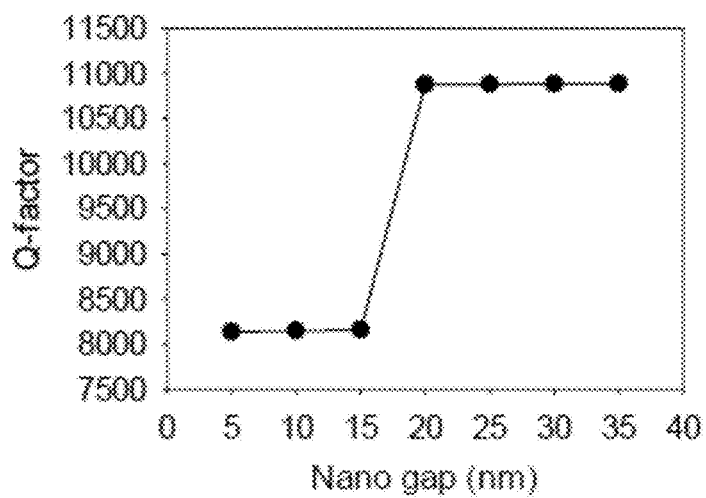
FIG. 9 is a graph of simulated Q-factors of nanopillar-based CRRs in accordance with principles of the present disclosure.

It should be noted that the Q-factor of the nanowire-based CRRs in accordance with principles of the present disclosure is dramatically enhanced (more than 1400 times than a conventional film-based device), which offers high sensitivity. To analyze the effect of geometry and a property of materials on the Q-factor, CRRs with different physical conditions were characterized with respect to the size (d) of nano gaps, and Q-factors were obtained from the simulation results of transmission spectra. As shown in FIG. 9, the size of nanogaps (d) affect the Q-factor of nanopillar-based CRRs. This can be explained in terms of energy stored in the capacitors formed between the nanowires inside the CRRs. The energy stored in a capacitor is defined as $U=q^2/2C$, where q is the electric charges on the capacitor and $C=\varepsilon \cdot A/d$ is the capacitance. Assuming that electric charges (q) formed on the surface of nanowires is constant, energy stored in the CRRs (U) is inversely proportional to the capacitance ($C=\varepsilon \cdot A/d$) between each two nanowires in the CRRs. The increase of nanogap size (d) decreases the capacitance (C), which results in the increase of the stored energy (U), thereby enhancing Q-factor. Other parameters can also be altered to optimize the Q-factor. For example, both height (h) and width (or diameter) (D) of nanopillars affect the interface area (A) facing between nanopillars. A decrease of height (h) or width (D) decreases the area (A) and the capacitance (C), which results in an increase of the energy stored (U) in the CRRs. Therefore, Q-factor may increase with the decrease of height (h) or width (or diameter) (D). Similarly, the decrease of permittivity ($\varepsilon$) of materials between the nanogaps may enhance the Q-factor of the nanopillar-based CRRs because a decrease of the permittivity ($\varepsilon$) of the nano gap reduces the capacitance (C), leading to more energy stored (U) in the CRRs.

In some embodiments of the present disclosure, the Q-factors of nanopillar-based CRR MMs utilizing displacement current are enhanced to at least 11000 as shown in FIG. 9. In other embodiments, ultra-high Q-factors on the order of 14000 are achieved.

Figure 10A:
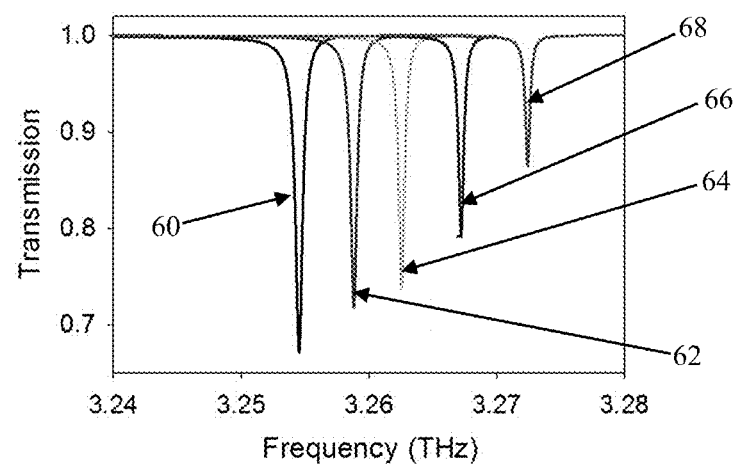
FIG. 10A is a graph of transmission spectra of simulated nanopillar-based CRRs in accordance with principles of the present disclosure at different nano gap sizes.

As indicated above, various geometric parameters of the nanopillars forming the nanopillar-based CRRs of the present disclosure can be varied, such as size of the nano gaps (d) between the nanopillars, height (h) of the nanopillars, width (e.g., diameter) (D) of the nanopillars, and the permittivity ($\varepsilon$) of the media where the nanopillar-based CRR is located (including permittivity of the nano gaps). FIG. 10A illustrates transmission spectra at varying nano gap sizes (d) of 5 nm (plot line 60), 10 nm (plot line 62), 20 nm (plot line 64), 50 nm (plot line 66), and 100 nm (plot line 68) for a nanopillar-based CRR of the present disclosure and fabricated with gold (Au) nanopillars. As shown, the magnitude of the resonant peak of the nanopillar-based CRR increases with an increase of the nano gap size. This can be explained by Equation (1) of displacement current ($I_d$) in the CRRs. When the nano gap size (d) increases, displacement current ($I_d$) decreases, resulting in the decrease of the resonant magnitude. On the other hand, the resonant frequency (f) of the nanopillar-based CRR increases with the increase of the nano gap size (d) due to the decrease of the capacitance (C) of the CRR, leading to the increase of the angular frequency ($\omega$) as explained by the following equation:

$$f = \frac{\omega}{2\pi} = \frac{1}{2\pi\sqrt{LC}} = \frac{1}{2\pi\sqrt{L\varepsilon\frac{A}{d}}} \quad (2)$$

where f is the frequency of the electromagnetic wave, L is the inductance of the CRR, and C is the capacitance of the CRR.

Figure 10B:
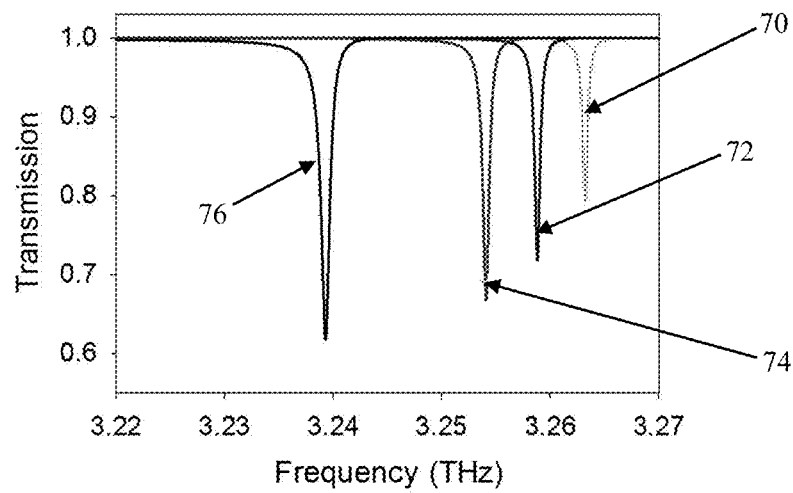
FIG. 10B is a graph of transmission spectra of simulated nanopillar-based CRRs in accordance with principles of the present disclosure at different nanopillar heights.
Figure 10C:
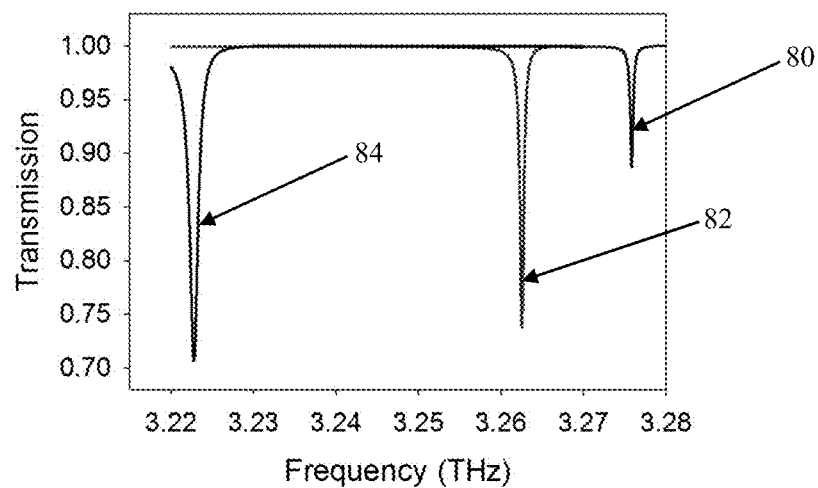
FIG. 10C is a graph of transmission spectra of simulated nanopillar-based CRRs in accordance with principles of the present disclosure at different nanopillar diameters.

FIG. 10B illustrates transmission spectra at varying nanopillar heights (h) of 100 nm (plot line 70), 300 nm (plot line 72), 500 nm (plot line 74), and 1000 nm (plot line 76) for a nanopillar-based CRR of the present disclosure and fabricated with gold (Au) nanopillars. FIG. 10C illustrates transmission spectra at varying nanopillar diameters (D) of 0.5 µm (plot line 80), 1 µm (plot line 82), and 2 µm (plot line 84) for a nanopillar-based CRR of the present disclosure and fabricated with gold (Au) nanopillars. FIGS. 10B and 10C reflect that the resonant magnitude decreases with the increase of h and/or D. This is because h and D determine the side area of the nanopillars ($A=\pi \cdot (D/2) \cdot h$). The increase of h and/or D results in the increase in A, leading to the decrease of $I_d$ based on Equation (1). In addition, the resonant frequency (f) decreases with the increase of h and/or D, which can be explained from Equation (2); the increase of h and/or D leads to the increase of A, which decreases f.

Figure 10D:
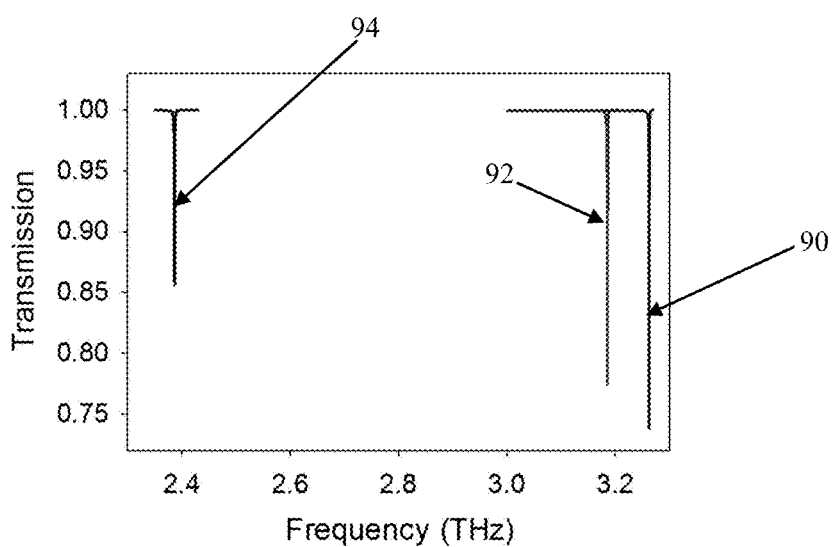
FIG. 10D is a graph of transmission spectra of simulated nanopillar-based CRRs in accordance with principles of the present disclosure at different permittivity.

The permittivity ($\varepsilon$) of the media can also play a role in tuning the resonant behavior of the nanopillar-based CRRs of the present disclosure. FIG. 10D illustrates transmission spectra at varying permittivity ($\varepsilon$) of 1 (plot line 90), 2 (plot line 92), and 3.9 (plot line 94) for a nanopillar-based CRR of the present disclosure and fabricated with gold (Au) nanopillars. As reflected by FIG. 10D, the resonant magnitude is proportional to c and inversely related to $\varepsilon$.

Figure 11A:
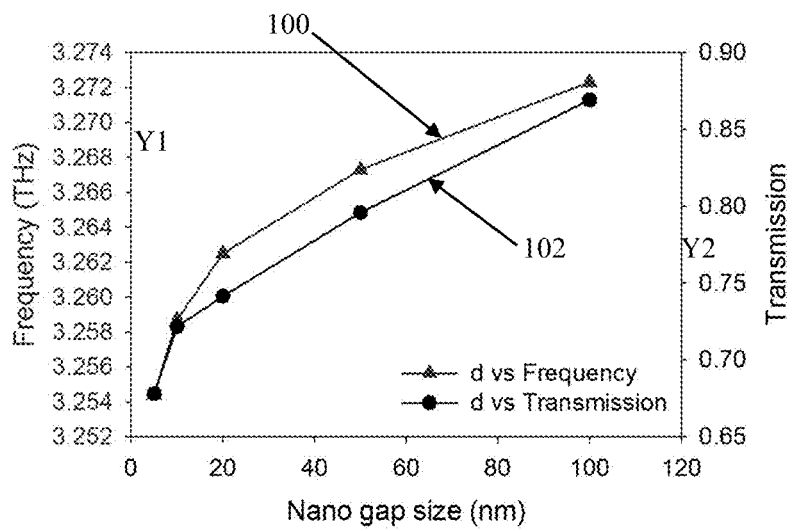
FIG. 11A is a graph of resonant frequencies and transmission spectra of simulated nanopillar-based CRRs in accordance with principles of the present disclosure at different nano gap sizes.
Figure 11B:
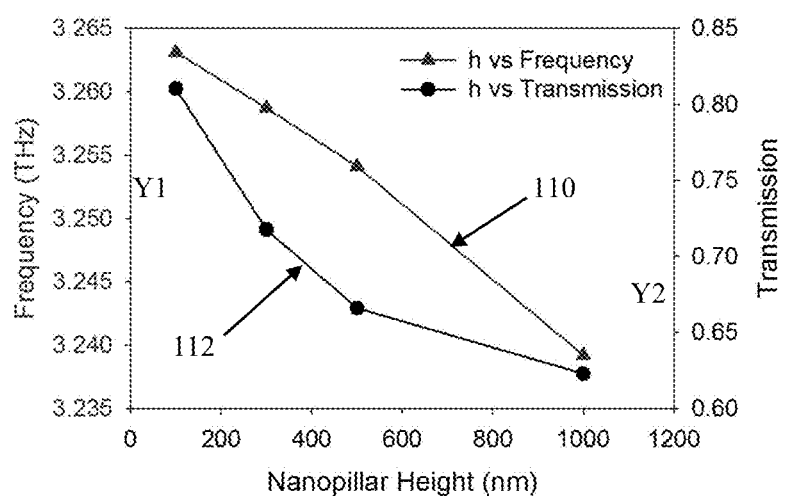
FIG. 11B is a graph of resonant frequencies and transmission spectra of simulated nanopillar-based CRRs in accordance with principles of the present disclosure at different nanopillar heights.
Figure 11C:
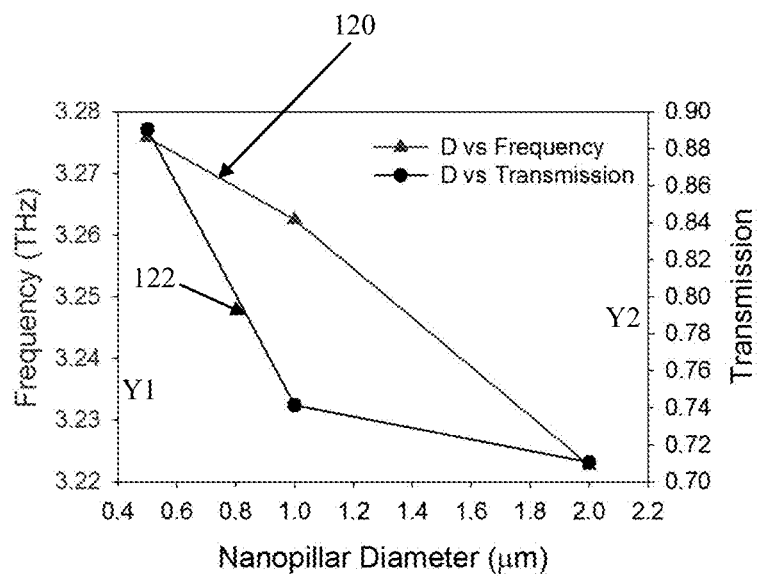
FIG. 11C is a graph of resonant frequencies and transmission spectra of simulated nanopillar-based CRRs in accordance with principles of the present disclosure at different nanopillar diameters.
Figure 11D:
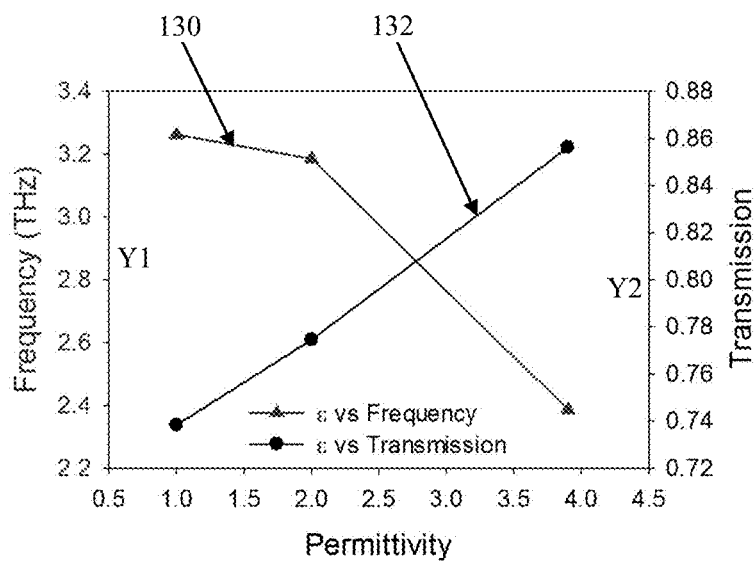
FIG. 11D is a graph of resonant frequencies and transmission spectra of simulated nanopillar-based CRRs in accordance with principles of the present disclosure at different permittivity.

The relationship between resonant magnitude and permittivity $\varepsilon$ can also be demonstrated by Equation (1) and Equation (2). Resonant frequency and magnitude comparisons for nanopillar-based CRRs of the present disclosure and fabricated with gold nanopillars with varying nano gap (d) sizes are presented in FIG. 11A; plot line 100 represents nano gap (d) sizes versus resonant frequency (axis Y1) and plot line 102 represents nano gap (d) sizes versus magnitude (axis Y2). Resonant frequency and magnitude comparisons for nanopillar-based CRRs of the present disclosure and fabricated with gold nanopillars with varying nanopillar heights (h) are presented in FIG. 11B; plot line 110 represents nanopillar height (h) versus resonant frequency (axis Y1) and plot line 112 represents nanopillar height (h) versus magnitude (axis Y2). Resonant frequency and magnitude comparisons for nanopillar-based CRRs of the present disclosure and fabricated with gold nanopillars with varying nanopillar diameters (D) are presented in FIG. 11C; plot line 120 represents nanopillar diameter (D) versus resonant frequency (axis Y1) and plot line 122 represents nanopillar diameter (D) versus magnitude (axis Y2). Resonant frequency and magnitude comparisons for nanopillar-based CRRs of the present disclosure and fabricated with gold nanopillars with varying permittivity ($\varepsilon$) are presented in FIG. 11D; plot line 130 represents permittivity ($\varepsilon$) versus resonant frequency (axis Y1) and plot line 132 represents permittivity ($\varepsilon$) versus magnitude (axis Y2). It is noted that in FIGS. 11A-11D, the value of the transmission is opposite to the resonant magnitude of the CRRs (i.e., "1" represents complete reflection, and "0" represents complete transmission). From FIGS. 11A-11D, the resonant magnitude and frequency have the opposite response to all the geometric parameters (d, h, D, and c), which agrees with Equations (1) and (2).

The Q-factor achieved or available with the nanopillar-based CRRs of the present disclosure can be selected as a function of one or more geometric parameters. The Q-factor of the nanopillar-based CRRs of the some embodiments of the present disclosure can depend upon the energy storage (U) inside the CRR. Since nanopillars and nano gaps are used to construct the CRRs, thousands of the capacitors (between every two, immediately adjacent nanopillars) are formed inside the CRR. The total energy stored in the nanopillar-based CRR can be regarded as the sum of the energy stored in each capacitor. The energy storage of each such capacitor can be expressed with the charges (q) of the nanopillars and the capacitance (C) of the capacitors as in Equation (3):

$$U = \frac{q^2}{2C} = \frac{q^2}{2\varepsilon \frac{A}{d}} \quad (3)$$

It is assumed that the total charges of the CRR (q) does not change due to the same electromagnetic field applied to all of nanopillar-based CRRs and the same configuration of the CRR structure. The total energy storage (U) of the nanopillar-based CRR is inversely proportional to the total capacitance (C) of the CRR. Thus, the Q-factor of the nanopillar-based CRRs of the present disclosure can be inversely proportional to the total capacitance (C) of the CRR.

Figure 12A:
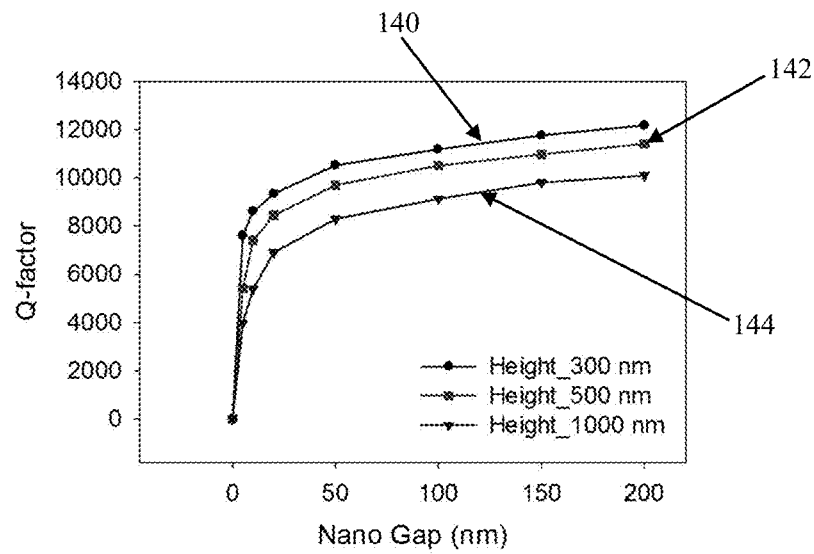
FIG. 12A is a graph of Q-factor as a function of nano gap size of simulated nanopillar-based CRRs in accordance with principles of the present disclosure at different nanopillar heights.
Figure 12B:
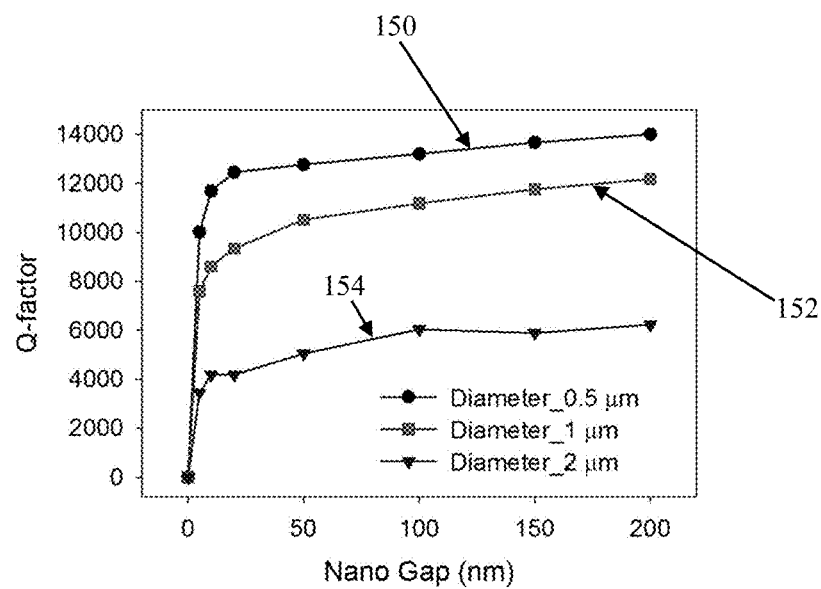
FIG. 12B is a graph of Q-factor as a function of nano gap size of simulated nanopillar-based CRRs in accordance with principles of the present disclosure at different nanopillar diameters.
Figure 12C:
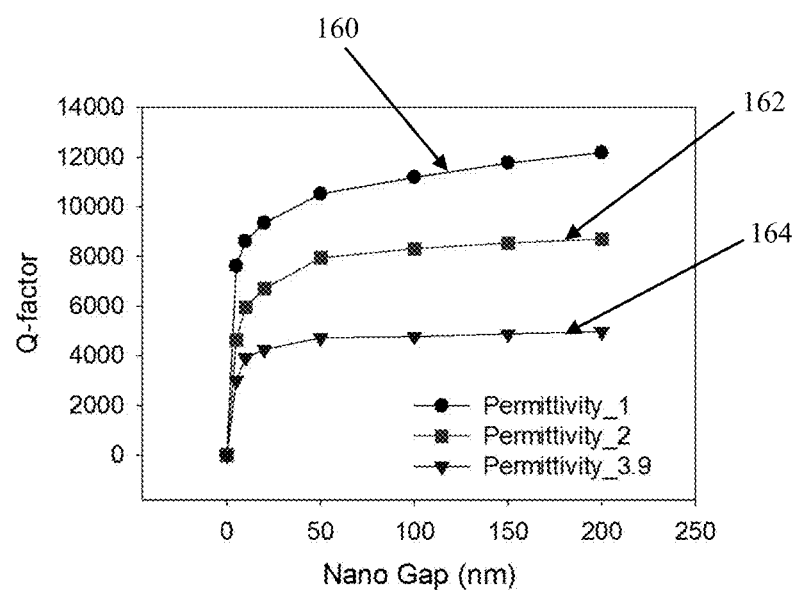
FIG. 12C is a graph of Q-factor as a function of nano gap size of simulated nanopillar-based CRRs in accordance with principles of the present disclosure at different permittivity.

With the above in mind, FIG. 12A illustrates the Q-factor change with different nanopillar heights (h) of 300 nm (plot line 140), 500 nm (plot line 142), and 1000 nm (plot line 144) relative to various nano gap (d) sizes for a nanopillar-based CRR of the present disclosure and fabricated with gold (Au) nanopillars. With the analysis of FIG. 12A, the diameter (D) of the nanopillars was fixed at 0.5 μm, and the permittivity (ε) of the media was fixed at 1. As shown, a Q-factor of around 12000 can be achieved with the largest nano gap (d) size and smallest nanopillar height (h). FIG. 12B illustrates the Q-factor change with different nanopillar diameters (D) of 0.5 μm (plot line 150), 1 μm (plot line 152), and 2 μm (plot line 154) relative to various nano gap (d) sizes for a nanopillar-based CRR of the present disclosure and fabricated with gold (Au) nanopillars. With the analysis of FIG. 12B, the height (h) of the nanopillars was fixed at 300 nm, and the permittivity (ε) of the media was fixed at 1. It will be recalled that an increase in the diameter (D) of the nanopillars also increases the surface area (A). As shown in FIG. 12B, increasing the diameter (D) of the nanopillars increases the Q-factor. A Q-factor of around 14000 can be achieved by increasing the nano gap (d) size and decreasing the nanopillar diameter (D). FIG. 12C illustrates the Q-factor change with different permittivity (ε) of 1 (plot line 160), 2 (plot line 162), and 3.9 (plot line 164) relative to various nano gap (d) sizes for a nanopillar-based CRR of the present disclosure and fabricated with gold (Au) nanopillars. With the analysis of FIG. 12C, the height (h) of the nanopillars was fixed at 300 nm, and the diameter (D) of the nanopillars was fixed at 0.5 μm. It will be recalled that the total capacitance (C) value of the nanopillar-based CRR is proportional to permittivity (ε). As shown in FIG. 12C, increasing the permittivity (ε) decreases the Q-factor. A Q-factor of around 12000 can be achieved with a large nano gap (d) size and a low permittivity (ε) of 1.

Figure 13A:
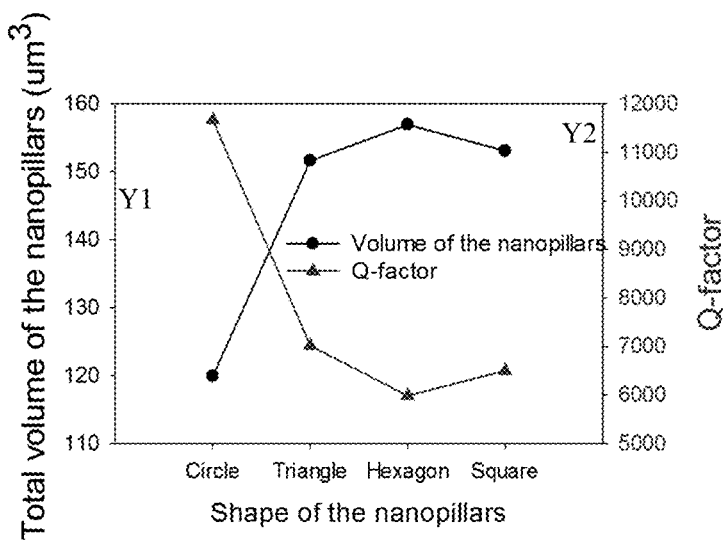
FIG. 13A is a graph of total volume of nanopillars and Q-factor of simulated nanopillar-based CRRs in accordance with principles of the present disclosure with nanopillars of various shapes.
Figure 13B:
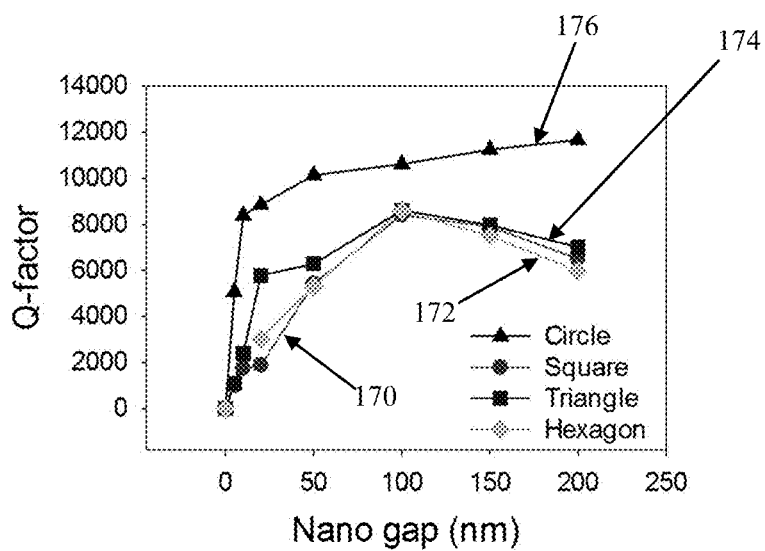
FIG. 13B is a graph of Q-factor as a function of nano gap size of simulated nanopillar-based CRRs in accordance with principles of the present disclosure with nanopillars of various shapes.

The Q-factor achieved or available with the nanopillar-based CRRs of the present disclosure can be selected as a function of the shape of the nanopillars. The shape of the nanopillars can dictate the total volume of nanopillars comprising the nanopillar-based CRR. For example, FIG. 13A illustrates the difference in total volume (axis Y1) of nanopillars in a nanopillar-based CRR of the present disclosure and corresponding Q-factor (axis Y2) for different nanopillar shapes, including circular (akin to FIG. 1C), triangular (akin to FIG. 2B), hexagon (akin to FIG. 2C), and square (akin to FIG. 2A). With the analysis of FIG. 13A, the total number of nanopillars inside the CRR and the nano gap (d) size remained the same. Since the increase of the volume of the nanopillars introduces more ohmic losses to the CRR, the Q-factor of the nanopillar-based CRR decreases. FIG. 13A further reveals that that the Q-factor of the nanopillar-based CRR with circular nanopillars can have a significant improvement over other shapes; this is due to the side wall of the circular nanopillar having an arc shape. FIG. 13B illustrates the Q-factor of the nanopillar-based CRRs of the present disclosure with different nanopillar shapes (i.e., square (plot line 170), hexagon (plot line 172), triangle (plot line 174), and circle (plot line 176)) at different nano gap (d) sizes. It will be recalled that the nano gap (d) size of the nanopillars only defines the shortest distance between the two nanopillars. However, the actual space between two circular nanopillars is much larger than the nano gap (d) size. On the other hand, the space between square, triangle, and hexagon nanopillars is strictly defined by the nano gap (d) size. The large space between circular nanopillars leads to a decrease of the capacitance (C) of the nanopillar-based CRR, which in turn enhances the Q-factor as shown in FIG. 13B. A highest Q-factor of around 12000 can be achieved with the smallest volume of nanopillars (e.g., circular nanopillars) and the largest nano gap (d) size of 200 nm.

Figure 14A:
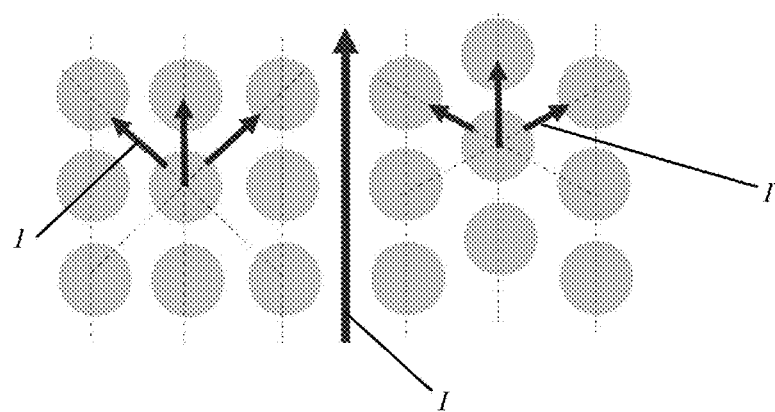
FIG. 14A is a simplified top view of a portion of an aligned nanopillar-based CRR of the present disclosure and of a zigzag nanopillar-based CRR of the present disclosure and identifying current flow.
Figure 14B:
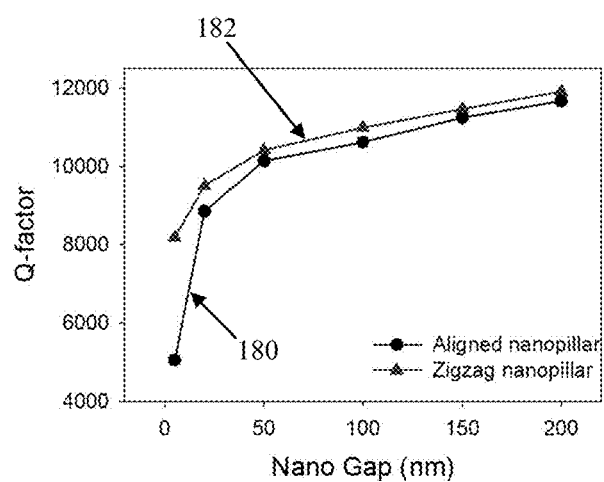
FIG. 14B is a graph of Q-factor as a function of nano gap size of simulated aligned nanopillar-based CRRs of the present disclosure and of simulated zigzag nanopillar-based CRR of the present disclosure.
Figure 14C:
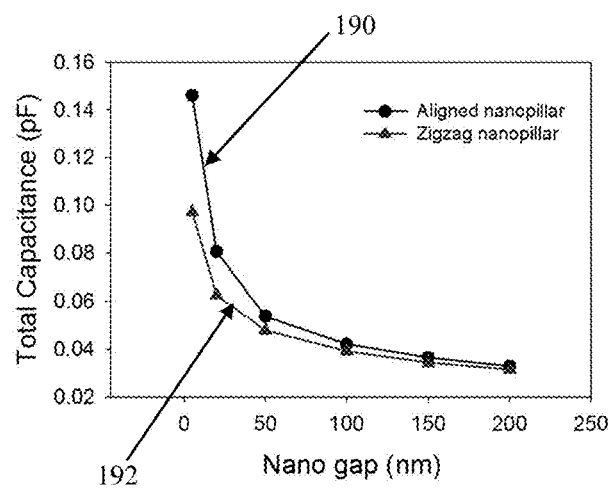
FIG. 14C is a graph of total capacitance as a function of nano gap size of simulated aligned nanopillar-based CRRs and of simulated zigzag nanopillar-based CRR of the present disclosure.

The Q-factor achieved or available with the nanopillar-based CRRs of the present disclosure can be selected as a function of the arrangement of the nanopillars within the CRR-defining array. For example, the nanopillars can be aligned relative to one another (as in FIG. 1B, for example) or can be off-set or "zigzag" relative to one another (as in FIG. 3, for example). The nanopillars in either arrangement or configuration can be arranged in such a way that the current flow in the CRR is always in parallel with the nano gap (d). For example, FIG. 14A represents current flow (arrows 1) with aligned nanopillars (left hand view of FIG. 14A), and off-set or "zigzag" nanopillars (right hand view of FIG. 14A). Since different configurations or arrangements of the nanopillars results in changes in capacitance of the corresponding, nanopillar-based CRR, the Q-factor will also differ. FIG. 14B illustrates the Q-factor change with different nanopillar arrangements (aligned nanopillars (plot line 180), and zig zag nanopillars (plot line 182)) at different nano gap (d) sizes for simulated nanopillar-based CRRs of the present disclosure and fabricated with gold (Au) nanopillars. As shown in FIG. 14B, zigzag nanopillar-based CRRs have a Q-factor higher than that of the aligned nanopillar-based CRRs. The total capacitance (C) of the simulated nanopillar-based CRRs with aligned nanopillars and zigzag nanopillars was modeled and calculated, the results of which are shown in FIG. 14C (where plot line 190 represents the aligned nanopillar arrangement, and plot line 192 represents the zigzag nanopillar arrangement). The zigzag nanopillar-based CRR has a lower total capacitance (C) as compared to the aligned nanopillar-based CRR due to the total shorter distance among nanopillars (C=εA/d). Assuming the charge densities (q) does not change between aligned and zigzag nanopillar-based CRRs, the energy stored (U) in the zigzag nanopillar-based CRR is larger than that of the aligned nanopillar-based CRR based on Equation (3), leading to a higher Q-factor.

Figure 14D:
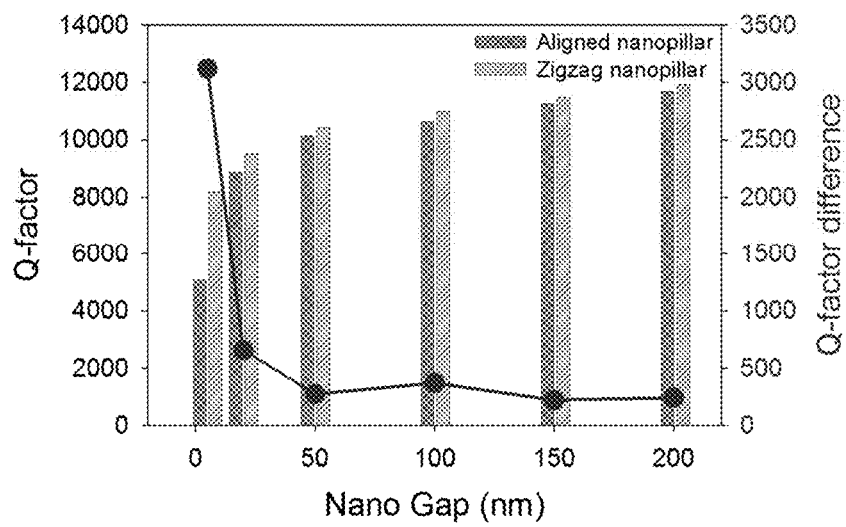
FIG. 14D is a chart of the Q-factors and difference in Q-factors of the simulated aligned nanopillar-based CRRs and simulated zigzag nanopillar-based CRRs reported in FIG. 14B.
Figure 14E:
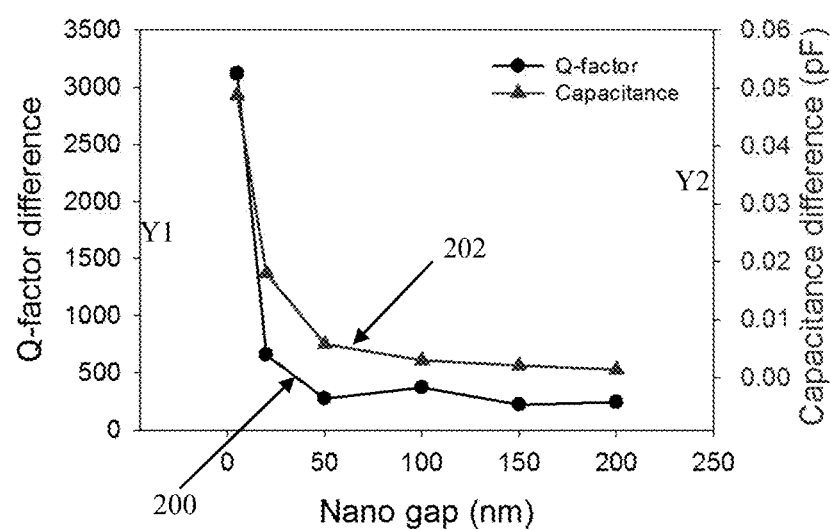
FIG. 14E is a graph of difference of Q-factor and different of total capacitance of the simulated aligned nanopillar-based CRRs and simulated zigzag nanopillar-based CRRs reported in FIGS. 14B and 14C.

FIG. 14D shows the Q-factor difference between simulated aligned nanopillar-based CRRs and simulated zigzag nanopillar-based CRRs at different nano gap (d) sizes (with the simulations utilizing identically sized and shaped Au nanopillars). The decrease of the nano gap (d) size increased the Q-factor difference between the aligned and zigzag nanopillar-based CRRs. A largest Q-factor difference of around 3000 can be achieved at the nano gap (d) size of 5 nm. These results are further understood with reference to FIG. 14E that shows a comparison between Q-factor difference (axis Y1) and total capacitance (C) difference (axis Y2) of the simulated aligned nanopillar-based CRRs and simulated zigzag nanopillar-based CRRs at different nano gap (d) sizes. Plot line 200 represents the Q-factor difference between the two formats, and plot line 202 represents the total capacitance difference between the two formats. The total capacitance (C) difference reaches its maximum of 0.06 pF at a nano gap (d) size of 5 nm, leading to a maximum Q-factor difference of around 3000.

The Q-factor achieved or available with the nanopillar-based CRRs of the present disclosure can be greater than the Q-factor available with a nanopillar-based split ring resonator (SRR) structure, for example the nanopillar-based SRRs described in U.S. Non-Provisional patent application Ser. No. 15/482,409, filed Apr. 7, 2017, entitled "Nanopillar-Based Article and Methods of Manufacture". The nanopillar-based CRR and nanopillar SRR share the concept of using nanoscale gaps between nanopillars to reduce the energy loss due to electrical current passing through the conductors (i.e., the nanopillars). A strong electric field can be trapped inside the nano gaps, leading to a high Q-factor. However, it has surprisingly been discovered that an ultra-high Q-factor can be achieved by closing the split of the nanopillar-based SRR (i.e., a CRR structure). When the electromagnetic wave is perpendicular to the SRR plane, two different modes can be excited depending upon the orientation of the electric field. If the electric field is parallel to the split of the SRR, due to the asymmetry of the SRR along the electric field, different charge densities will be generated on the arms with and without the split. The charge density difference produces a loop of current around the SRR. In such a situation, the SRR acts as an LC circuit with the inductance (L) along the arms of the SRR, and the capacitance (C) in the split. The resonance excited by the electric field parallel to the split is referred to as electric filed excited magnetic response (EEMR). On the other hand, if the electric filed is parallel to the two continuous arms SRR that do not otherwise have a split, the SRR is symmetric along the electric field. Since the charges are equally distributed along the two continuous arms of the SRR, no loop current will be generated. However, current does oscillate in the two continuous SRR arms following the electric field. This resonance of the SRR is referred to as electric field excited response (ER). For EEMR of the SRRs, the charge densities of the split arm is much small than that of the continuous arm due to the split breaking the electric field, leading to a much smaller total charge density (q) compared to that of the ER of the SRRs. Since the energy stored in the SRR (U) is the sum of the energy stored in each small capacitor (i.e., two nanopillars and the corresponding nano gap) of the SRRs, U is proportional to $q^2$ ($U=q^2/2C$). Thus, the Q-factor of the ER is much higher than the Q-factor of the EEMR of the SRR. The nanopillar-based CRRs of the present disclosure close the split of the SRR, and are always in ER mode regardless of the orientation of the electric field. Thus, an ultra-high Q-factor can be achieved. Additionally, it has surprisingly been found that since a larger charge distribution can be achieved using nanopillar-based CRRs compared to nanopillar-based SRRs, an ultra-high Q-factor of around 14000 can be obtained. Such ultra-high Q-factor is more than 45 times greater than the reported Q-factor of the nanopillar-based SRRs.

Another factor that affects the sensitivity of CRRs is frequency shift. Larger frequency shift under a certain permittivity ($\varepsilon$) change around the CRRs means that even a small change of species can be easily detected. It could be expected that the significantly increased surface area could induce large frequency shift, meaning high sensitivity, to a change of substance around the CRRs. Nanopillar-based CRRs of the present disclosure can be used as the detecting part in bio- and chemical-sensors. When bio- and chemical-substance is presented near the nanowire-based CRR or between the nanowires, notable frequency shifts can be observed and the frequency shift depends on the permittivity of the substance. By analyzing the frequency shift of the CRRs, it is possible to detect the substance material. Nanopillar-based CRRs of the present disclosure can also be integrated into a "lab-on-chip" microsystem, enabling the realization of culture, treatment, selection, separation and analysis of the biomaterials and cells on the same chip in real time. Thus, in some embodiments, the CRRs of the present disclosure open a new window for fast and precise biological and chemical detection and dramatically enhances the ability to manipulate and control small volumes of analyte.

Embodiments and advantages of features of the present disclosure are further illustrated by the following non-limiting examples, but the particular materials and amounts thereof recited in these examples, as well as other conditions and details, should not be construed to unduly limit the scope of the present disclosure.

EXAMPLES

Figure 15A:
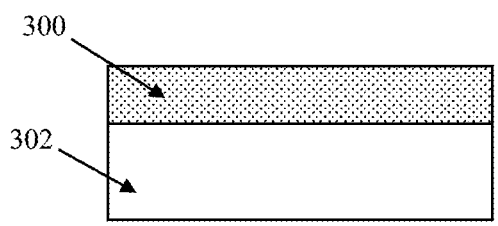
FIGS. 15A-15D schematically illustrate fabrication of a nanopillar-based CRR described in the Examples section.
Figure 15B:
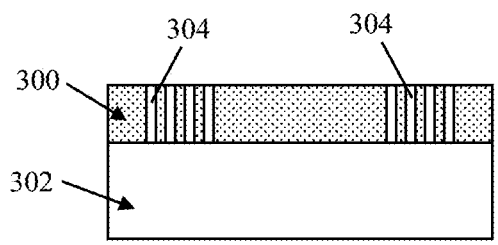
Figure 15C:
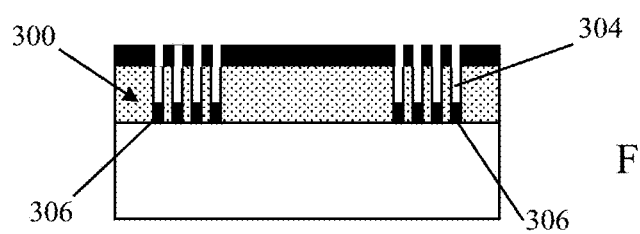
Figure 15D:
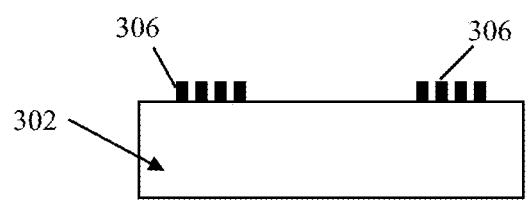

In order to demonstrate and analyze various features of the present disclosure, example nanopillar-based CRRs were designed and fabricated. FIGS. 15A-15D show the schematics of the fabrication process. First, a thin layer of a poly(methyl methacrylate) (PMMA) A photoresist (obtained from MicroChem Corp. of Newton, Mass.) 300 was spun coated on a silicon substrate 302 (FIG. 15A) at 3000 rpm to achieve a thickness of 200 nm. Circular nanopillars recesses 304 were then patterned on the photoresist using an electron beam (e-beam) lithography and lift process (FIG. 15B). 30 nm thick gold (Au) 306 was then deposited on the sample using an e-beam evaporation process (FIG. 15C). The photoresist 300 was then lifted off by immersing the sample in acetone and then rinsed in deionized water (FIG. 15D).

Figure 16A:
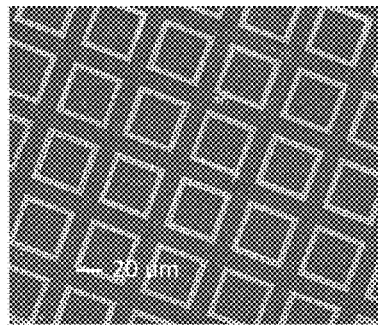
FIGS. 16A-16D are scanning electron microscope images of a nanopillar-based CRRs described in the Examples section.
Figure 16B:
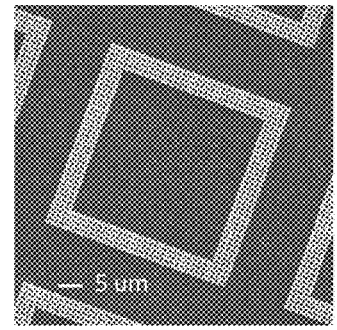
Figure 16C:
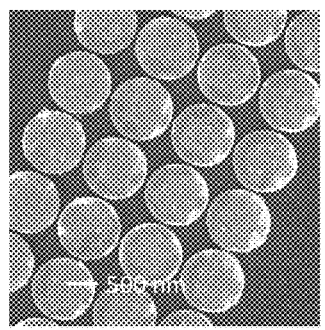
Figure 16D:
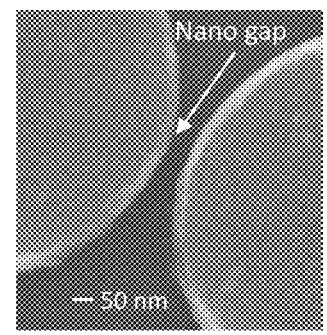

The scanning electron microscope (SEM) image of FIG. 16A depicts the array of nanopillar-based CRRs generated by the process above. FIG. 16B is a zoomed-in image of a single one of the CRRs. FIG. 16C is a zoomed-in image of several Au nanopillars of one of the CRRs. The diameter of the Au nanopillars was found to be 1 μm, and the thickness or height was found to be 30 nm. The image of FIG. 16D depicts the nano gap between two of the Au nanopillars; a size of the nano gap was found to be 50 nm. The well-defined nanopillars and nano gaps confirms successful fabrication of the nanopillar-based CRRs. A nanopillar-based CRR array with a large area can also be achieved, confirming the feasibility of designing and fabricating large devices using such structures.

Figure 17:
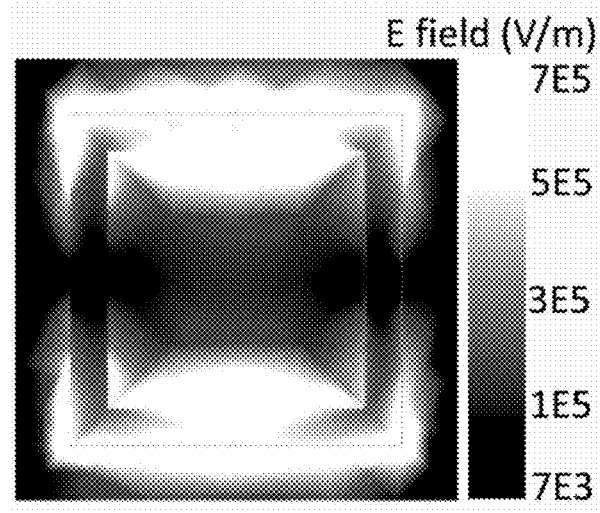
FIG. 17 is a graph of a simulated electric field distribution of a film-based CRR.
Figures 18A, 18B:
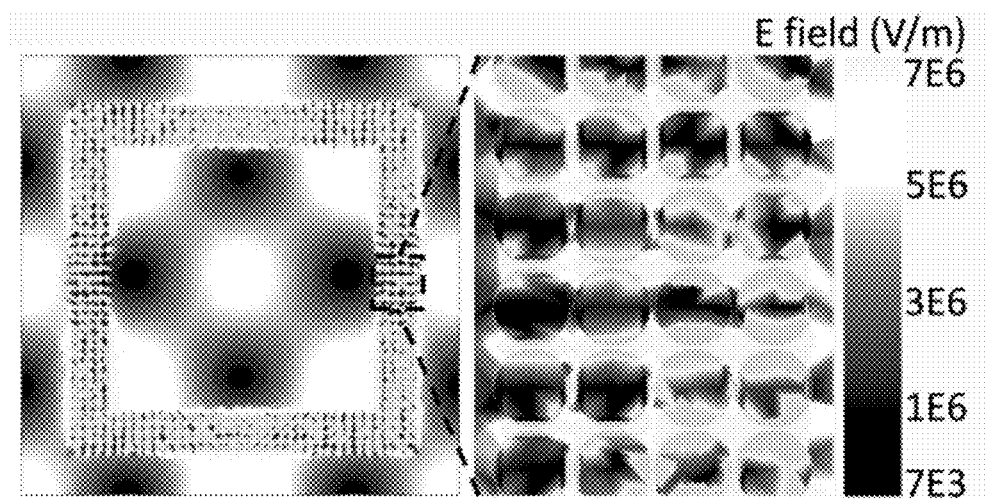
FIGS. 18A and 18B are graphs of a simulated electric field distribution of a nanopillar-based CRR described in the Examples section.

Electric field distributions of the nanopillar-based CRRs of the Examples section were obtained and compared with the electric field distribution of a similarly sized and shaped film-based CRR. The electric field distribution of the film-based CRR is provided in FIG. 17. FIG. 18A is the electric field distribution of the nanopillar-based CRR of the Examples section, FIG. 18B is an enlarged image of a portion of FIG. 18A. A much larger field enhancement ($7\times10^6$ V/m) was found inside the nano gaps of the nanopillar-based CRR, and was found to be 10 times larger than that of the film-based CRR (with a maximum electric field intensity of $7\times10^5$ V/m). These results illustrate that the nano gaps of the nanopillar-based CRR improve the energy storage of the CRR, which leads to a higher Q-factor.

The nanopillar-based Terahertz CRR metamaterials (MMs) of the present disclosure provide a marked improvement over previous designs. Nanopillar-based THz CRR MMs utilizing displacement current driving its resonant frequencies are enabled by the present disclosure and have been characterized. The displacement current between the nanowires drives the CRR working at its electromagnetic resonant frequencies. The nanopillar-based CRRs of the present disclosure can consist of thousands of nanopillars (e.g., Au nanopillars) with nanoscale gaps between them. The nano gaps reduce the ohmic loss inside the CRR, leading to a high Q-factor. The combination of CRR and nanopillars provides an electric resonant of the CRR to the electromagnetic field, which enhances the charge densities in the CRR. These enhanced charges results in a significant improvement in the energy storage inside the nano gaps, leading to an ultra-high Q-factor, for example on the order of 14000 in some embodiments. The ultra-high Q-factor nanopillar-based CRRs of the present disclosure offer ultra-sharp resonant peaks and high energy storage, which is more sensitive to any environmental changes. The nanopillar-based CRRs of the present disclosure are ideal candidates for ultra-sensitive biomaterial and chemical sensing, and highly selective frequency-tunable devices for example. Other end use applications are envisioned.

Although the present disclosure has been described with reference to preferred embodiments, workers skilled in the art will recognize that changes can be made in form and detail without departing from the spirit and scope of the present disclosure.

What is claimed is:

1. A metamaterial device comprising:
   a substrate; and
   a conductive pattern formed on the substrate and comprising a multiplicity of nanopillars, the conductive pattern forming a closed ring.

2. The metamaterial device of claim 1, wherein the metamaterial is a closed ring resonator having a Q-factor of greater than 11000.

3. The metamaterial device of claim 1, wherein immediately adjacent ones of the nanopillars of the multiplicity of nanopillars are spaced from one another by a nano gap.

4. The metamaterial device of claim 3, wherein the multiplicity of nanopillars are arranged in an array of rows of nanopillars, and further wherein the nanopillars of immediately adjacent rows of nanopillars are aligned with one another.

5. The metamaterial device of claim 3, wherein the multiplicity of nanopillars are arranged in an array of rows of nanopillars, and further wherein the nanopillars of immediately adjacent rows of nanopillars are offset relative to one another.

6. The metamaterial device of claim 1, wherein the multiplicity of nanopillars are metal.

7. The metamaterial device of claim 6, wherein the multiplicity of metal nanopillars are gold.

8. The metamaterial device of claim 1, wherein a cross-section of each of the nanopillars of the multiplicity of nanopillars has a shape selected from the group consisting of circle, triangle, square and hexagon.

9. The metamaterial device of claim 1, wherein the multiplicity of nanopillars are formed of an electrically conductive material, and further wherein the substrate is formed of an electrically insulative material, and further wherein the multiplicity of nanopillars contact and extend directly from the substrate.

10. The metamaterial device of claim 1, wherein the conductive pattern forms a square-shaped closed ring.

* * * * *